(12) United States Patent
Zhou et al.

(10) Patent No.: US 9,741,606 B2
(45) Date of Patent: Aug. 22, 2017

(54) DESMEAR WITH METALIZED PROTECTIVE FILM

(71) Applicant: INTEL CORPORATION, Santa Clara, CA (US)

(72) Inventors: Zheng Zhou, Chandler, AZ (US); Amanda E. Schuckman, Scottsdale, AZ (US); Sri Ranga Sai Boyapati, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/821,647

(22) Filed: Aug. 7, 2015

(65) Prior Publication Data
US 2017/0040211 A1    Feb. 9, 2017

(51) Int. Cl.
*H01L 23/498* (2006.01)
*H01L 21/768* (2006.01)
*H01L 23/14* (2006.01)
*H01L 21/48* (2006.01)

(52) U.S. Cl.
CPC ...... *H01L 21/76814* (2013.01); *H01L 21/486* (2013.01); *H01L 21/76804* (2013.01); *H01L 21/76816* (2013.01); *H01L 21/76879* (2013.01); *H01L 23/145* (2013.01); *H01L 23/49822* (2013.01); *H01L 23/49827* (2013.01)

(58) Field of Classification Search
CPC .......... H01L 23/49827; H01L 23/5226; H01L 23/5384; H01L 2221/1026; H01L 2221/1057; H01L 2225/06541
See application file for complete search history.

(56) References Cited

U.S. PATENT DOCUMENTS

| 2009/0242109 | A1 | 10/2009 | Nalla et al. |
| 2011/0135883 | A1 | 6/2011 | Jomaa et al. |
| 2014/0353019 | A1* | 12/2014 | Arora ................. C23C 14/228 174/258 |
| 2015/0083602 | A1* | 3/2015 | Nichols .................. C25D 5/022 205/126 |
| 2015/0084139 | A1 | 3/2015 | Teh et al. |

FOREIGN PATENT DOCUMENTS

| JP | 2004186231 A | 7/2004 |
| KR | 20130027048 A | 3/2013 |

OTHER PUBLICATIONS

International Search Report and Written Opinion mailed Oct. 18, 2016 for International Application No. PCT/US2016/041163, 13 pages.

* cited by examiner

*Primary Examiner* — Hoai V Pham
(74) *Attorney, Agent, or Firm* — Schwabe, Williamson & Wyatt, P.C.

(57) ABSTRACT

Embodiments herein may relate to a technique for generating a via in a substrate. Specifically, the technique may include coupling a polyethylene terephthalate (PET) layer, a protective metal layer, and a build-up layer to a metal layer. The process may further include etching a via in the PET layer, the protective metal layer, and at least a portion of the build-up layer. The process may further include performing a plasma desmear process on the substrate and then peeling the PET layer to remove the PET layer and the protective metal layer. Other embodiments may be described and/or claimed.

18 Claims, 8 Drawing Sheets

DESMEAR WITH METALIZED PROTECTIVE FILM

TECHNICAL FIELD

The present disclosure relates generally to the field of generating vias in substrates of integrated circuit (IC) packages, and more particularly to the field of desmear of said vias.

BACKGROUND

Traditionally in substrate build-up layer manufacturing, a wet desmear etching process may serve to both clean remaining laser via residue and to roughen the surface of a dielectric build-up layer for later electroless copper (Cu) adhesion. However, recent demand for finer pitch routing and high frequency data transfer integrity in high density interconnect substrates has highlighted the importance of low loss dielectric material and low interfacial surface roughness between the metal layer that results from the electroless Cu adhesion and the dielectric build-up layer.

Generally, legacy wet desmear processes may not be able to clean extremely low loss dielectric materials. One alternative process that may be used to adequately clean vias in extremely low loss dielectric materials subsequent to laser drilling of the vias may be to perform a plasma desmear process. Plasma desmear may be generally accomplished by capacitively coupled plasma (CCP), inductively coupled plasma (ICP), reactive ion etching (RIE), and/or some other type of plasma system using oxygen (O2) and/or fluorinated gases to etch organic layers of the dielectric material. While process conditions related to the plasma desmear may be optimized to reduce surface etching of the dielectric material, some etching will inevitably occur. This etching may potentially expose dielectric fillers, increase dielectric roughness, and/or potentially reduce adhesion strength to the electroless Cu.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
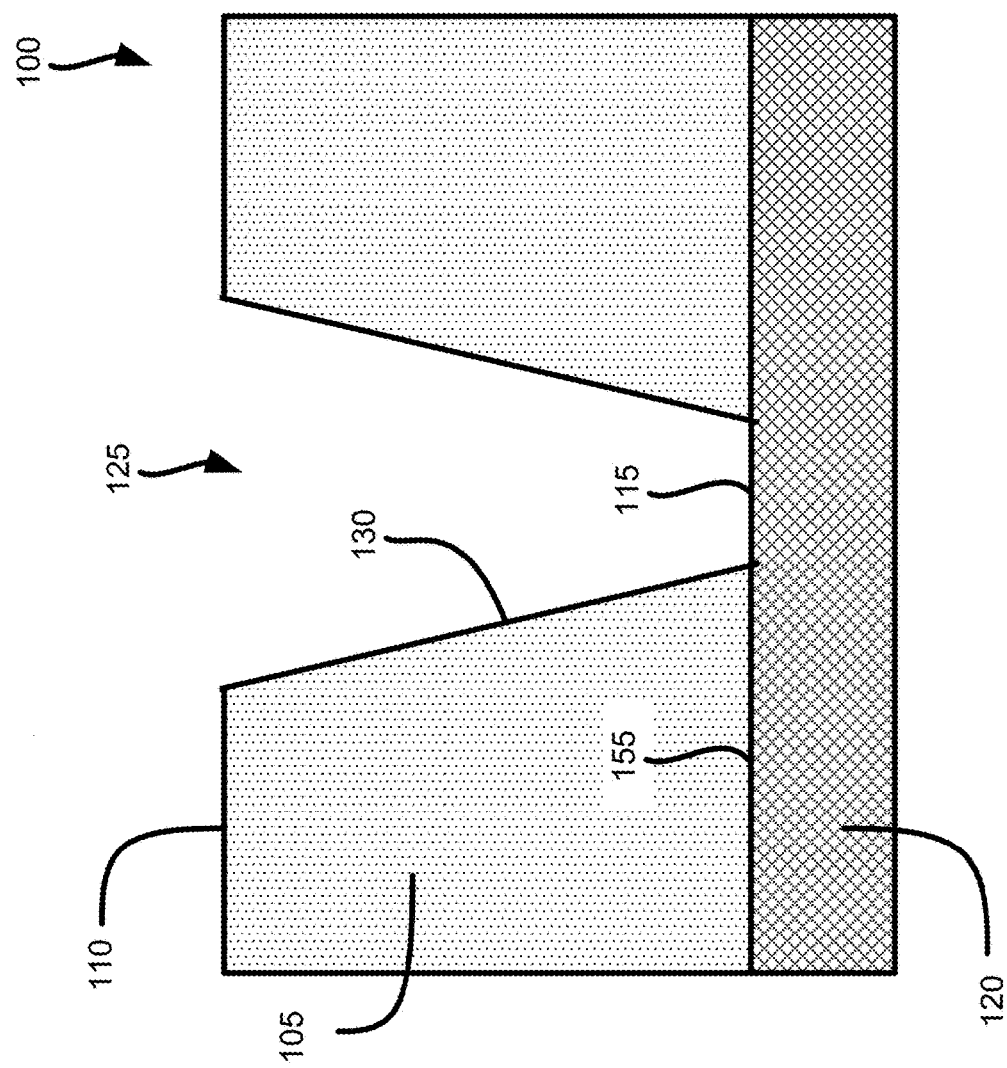
FIG. 1 is a simplified cross-sectional view of a substrate that includes a via, in accordance with various embodiments herein.

Embodiments herein may relate to substrates that include vias that were generated in the substrate by applying a polyethylene terephthalate (PET) layer and a protective metal layer to a build-up layer prior to generation of the via. The via may be generated in the PET layer, protective metal layer, and at least part of the build-up layer. A plasma desmear process may then be performed to remove at least a portion of the build-up layer and expose a metal layer on a side of the build-up layer opposite the PET layer. The PET layer may then be removed, which may in turn remove the protective metal layer.

The above described process provides benefits that may not have been present in legacy desmear processes. For example, one legacy process that may have been used to prevent surface etching of the build-up material during the desmear process may have been to apply a metallic mask to the build-up layer. For example, the metallic mask may have been a metal film that was sputtered onto the build-up layer prior to laser drilling of the via, and then the mask may have been etched away after the plasma desmear process was complete. However, the above described metallic mask may have had the negative consequence of increasing the cost of the resultant substrate, both due to the application of the mask and the subsequent etching process to remove the mask. The use of the metallic mask may also increase the surface roughness of the surface of the build-up layer to which the metallic mask was applied.

An alternative legacy process may have been to apply a PET layer to the build-up layer prior to generation of the via. However, this technique may have a disadvantage in that the reactive species used for the plasma desmear process may also react with the PET layer. Therefore, a large majority of the reactive species may be consumed prior to entering the via. The consumed reactive species may become non-reactive, and therefore may not be adequate to remove the remnants of the build-up layer at the bottom of the via. One way to overcome this deficiency may be to provide a very large amount of reactive species, but doing so may significantly deform the shape of the via, leading to structural weaknesses.

In contrast to the two above described legacy processes or techniques, embodiments herein may allow for production of build-up layers with significantly decreased surface roughness and well-formed vias in a cost-efficient manner.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

FIG. 1 is a simplified cross-sectional view of a substrate 100 that includes a via 125, in accordance with various embodiments herein. Specifically, the substrate 100 may include a metal layer 120 coupled to a dielectric build-up layer 105. In embodiments, the metal layer 120 may be copper, while in other embodiments the metal layer may be some other type of interconnect metal such as aluminum (Al) or tungsten (W), and/or some other type of appropriate interconnect metal. Similarly, the dielectric build-up layer 105 may include a material such as an Ajinomoto Build-up Film (ABF), a prepreg build-up film, or some other type of mold, dielectric, resist, reinforced, or laminate type film that has various properties including but not limited to low dielectric loss, low coefficient of thermal expansion (CTE), high thermal conductivity, high mechanical stability, or some other type of appropriate property.

The via 125 may go from a first surface 110 of the build-up layer 105 to the second surface 155 of the build-up layer 105, and expose a surface 115 of the metal layer 120 in the via 125. As can be seen, the via 125 may have relatively smooth sides 130 with a generally constant slope and direction from the first surface 110 of the build-up layer 105 to the second surface 155 of the build-up layer 105.

Generally, the via 125 may be described in three dimensions as frustoconical, i.e., as a cone with the tip of the cone removed. As shown in FIG. 1, the diameter of the frustoconical via 125 at the surface 110 of the build-up layer 105 may be larger than the diameter of the frustoconical via 125 at the surface 155 of build-up layer 105. However, in other embodiments the via 125 may have an oblong shape, an oval shape, a square shape, or some other type of shape when viewed from the top of the substrate 100 looking into the via 125.

As will be described in greater detail below, the substrate 100 may have been formed by applying a PET layer and a protective metal layer to the surface 110 of the build-up layer 105 prior to generation of the via 125. The via 125 may be generated in the PET layer, protective metal layer, and at least part of the build-up layer 105. A plasma desmear process may then be performed to remove at least a portion of the build-up layer and expose a surface 115 of the metal layer 120. The PET layer may then be removed, which may in turn remove the protective metal layer exposing the surface 110 of the build-up layer 105. Through this process, the surface 110 of the build-up layer 105 may have an average roughness (Ra) of between approximately 50 nanometers (nm) and approximately 100 nm. Additionally, as mentioned above, the sides 130 of the via 125 may be relatively smooth and well formed, with a generally uniform slope from the surface 110 to the surface 155 of the build-up layer 105.

Figure 2:
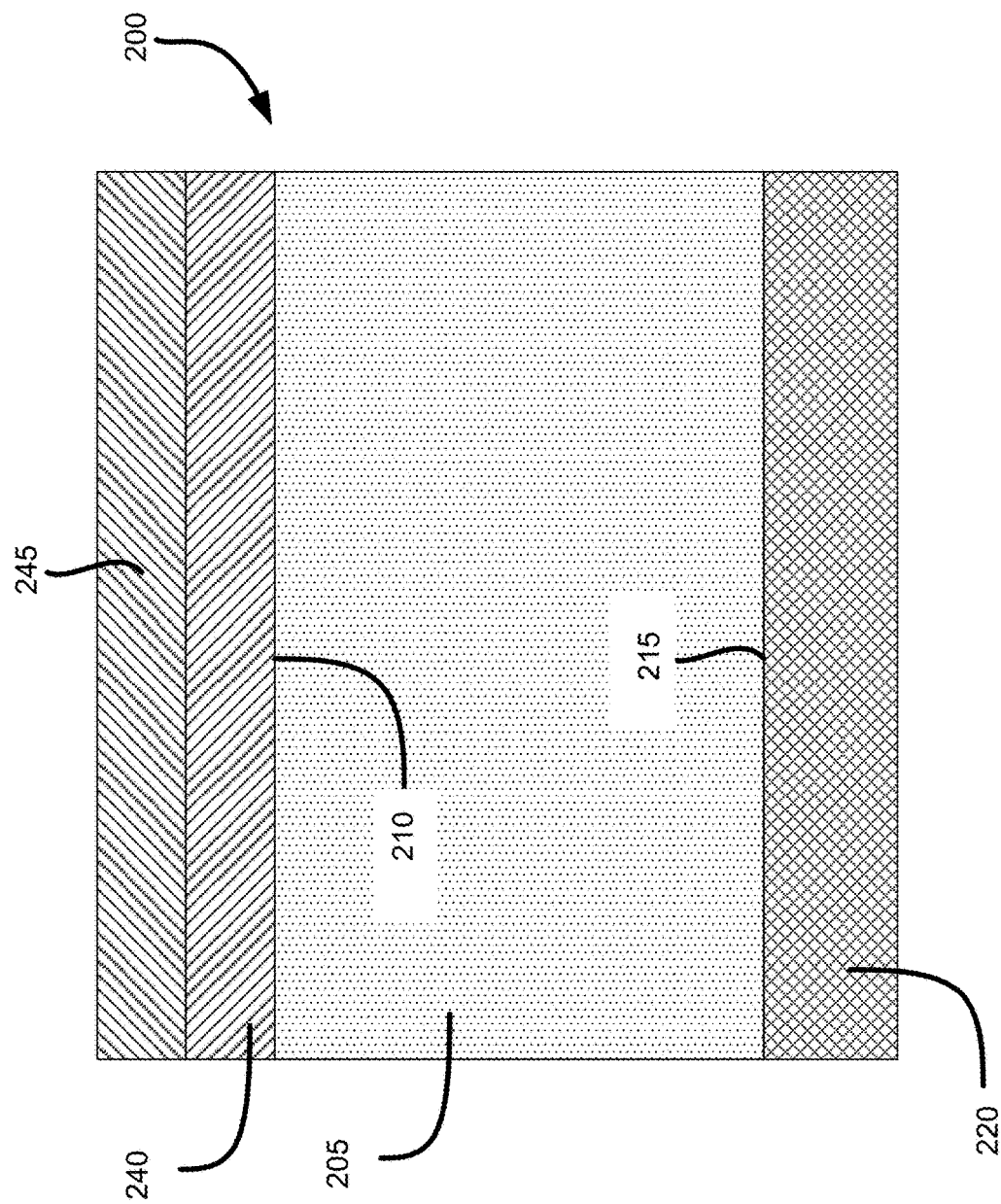
FIG. 2 depicts a stage of a process of generation of the substrate of FIG. 1, in accordance with various embodiments herein.

FIG. 2 depicts a stage of a process of generation of the substrate 100 of FIG. 1, in accordance with various embodiments herein. In an initial configuration 200, a build-up layer 205 (which may be similar to build-up layer 105) may be coupled with a surface 215 of a metal layer 220 (which may be similar to metal layer 120). A PET layer 240 and a protective metal layer 245 may be coupled with a surface 210 of the build-up layer 205 opposite the metal layer 220. In embodiments the PET layer 240 may be polyethylene terephthalate, polyethylene naphthalate PET, or some other type of PET layer. In embodiments, polyethylene naphthalate may be referred to as "PEN," but for the sake of consistency the term PET will be used herein and it will be understood that PET may refer to PET, PEN, or some other similar material. The protective metal layer 245 may be or may include aluminum (Al) or some other appropriate material.

In some embodiments, the PET layer 240 may be laminated together with build-up layer 205 prior to coupling of the build-up layer 205 to the metal layer 220. For example, in some embodiments, PET film may be manufactured and rolled. The build-up material may be laminated to the PET film and the PET/build-up material may be re-rolled. To generate the configuration 200, the laminated build-up material and PET film may be coupled with the metal layer 220 to form the metal layer 220, the build-up layer 205, and the PET layer 240. The protective metal layer 245 may be formed through deposition techniques such as sputtering or some other appropriate deposition technique.

In other embodiments, the protective metal film used in the protective metal layer 245 may be sputtered or otherwise deposited onto the PET film, and then the build-up layer 205 may be laminated to the PET film on a side of the PET film opposite the protective metal film. The combined protective metal film, PET film, and build-up layer 205 may be coupled with the metal layer 220 to generate the configuration 200 of FIG. 2.

It will be understood that the above described examples are intended as two example techniques that may be used to generate the configuration 200 of FIG. 2, and other embodiments may be based on other techniques or processes. Subsequent to generation of the configuration 200 of FIG. 2, a cure process may be performed on the metal layer 220, build-up layer 205, PET layer 240, and/or protective metal layer 245.

Figure 3:
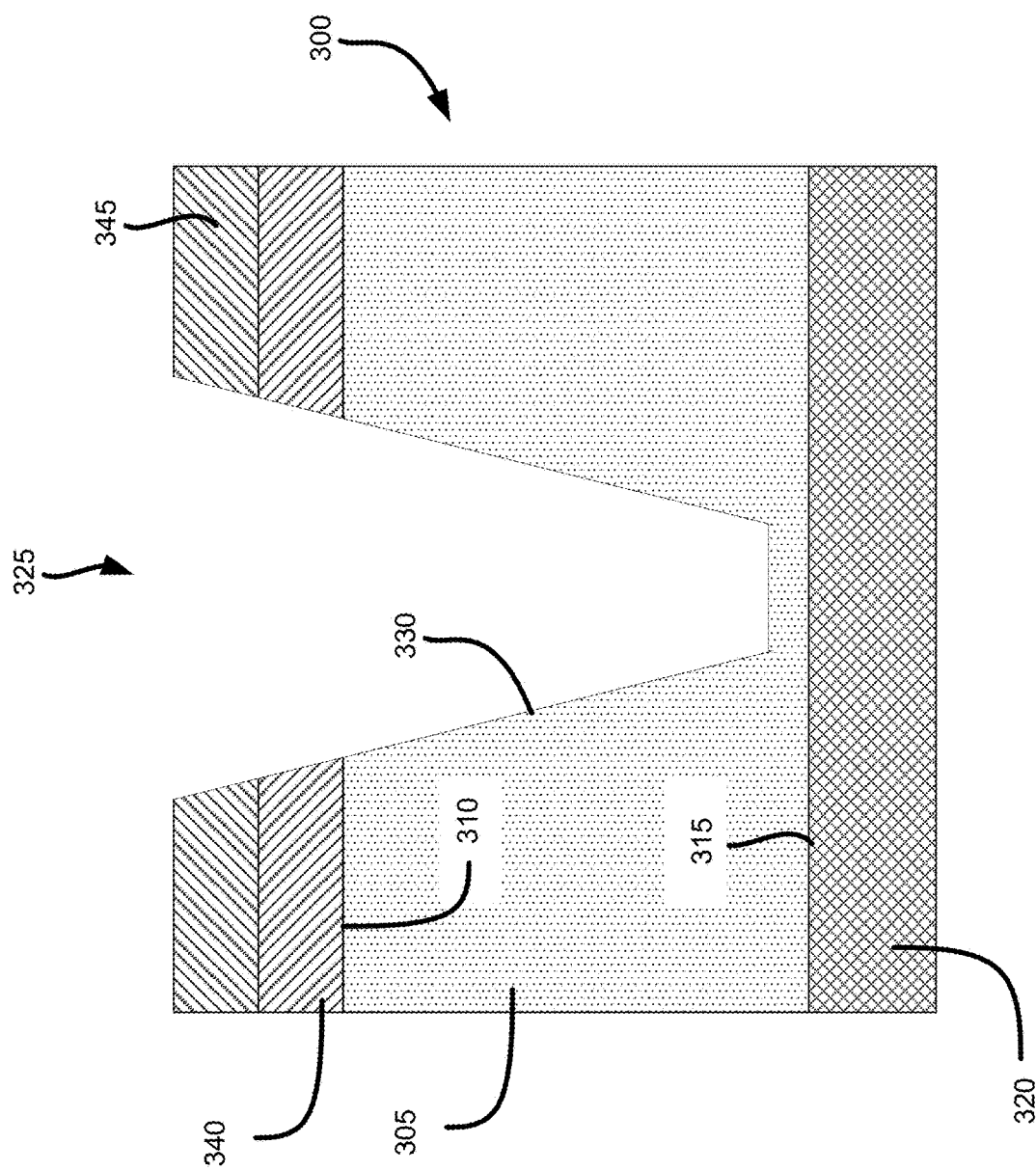
FIG. 3 depicts another stage of the process of generation of the substrate of FIG. 1, in accordance with various embodiments herein.

FIG. 3 depicts another stage of the process of generation of the substrate of FIG. 1, in accordance with various embodiments herein. Specifically, FIG. 3 depicts a configuration 300 that may occur subsequent to generation of the configuration 200 of FIG. 2. In embodiments, the configuration 300 may include a metal layer 320, build-up layer 305, PET layer 340, and protective metal layer 345 that may be respectively similar to metal layer 220, build-up layer 205, PET layer 240, and protective metal layer 245.

A via 325 may be generated through the protective metal layer 345, the PET layer 340, the first surface 310 of the build-up layer 305, and at least part of the build-up layer 305 as shown. Specifically, the via 325 may be formed through laser drilling, though in other embodiments the via 325 may be formed through some other optical, mechanical and/or chemical etching or drilling process. As shown, at least a portion of the build-up layer 305 may remain at the bottom of the via 325 such that the surface 315 of the metal layer 320 is not exposed in the via 325.

If the via 325 is formed through laser drilling, the via 325 may be generally frustoconical and have relatively smooth sidewalls 330 that have a larger diameter at a part of the via 325 near the protective metal layer 345 than a part of the via 325 near the metal layer 320, as shown. However, as noted above a frustoconical shape is one example and in other embodiments the shape of the via 325 may be different dependent on the process or technique used to generate the via 325.

Figure 4:
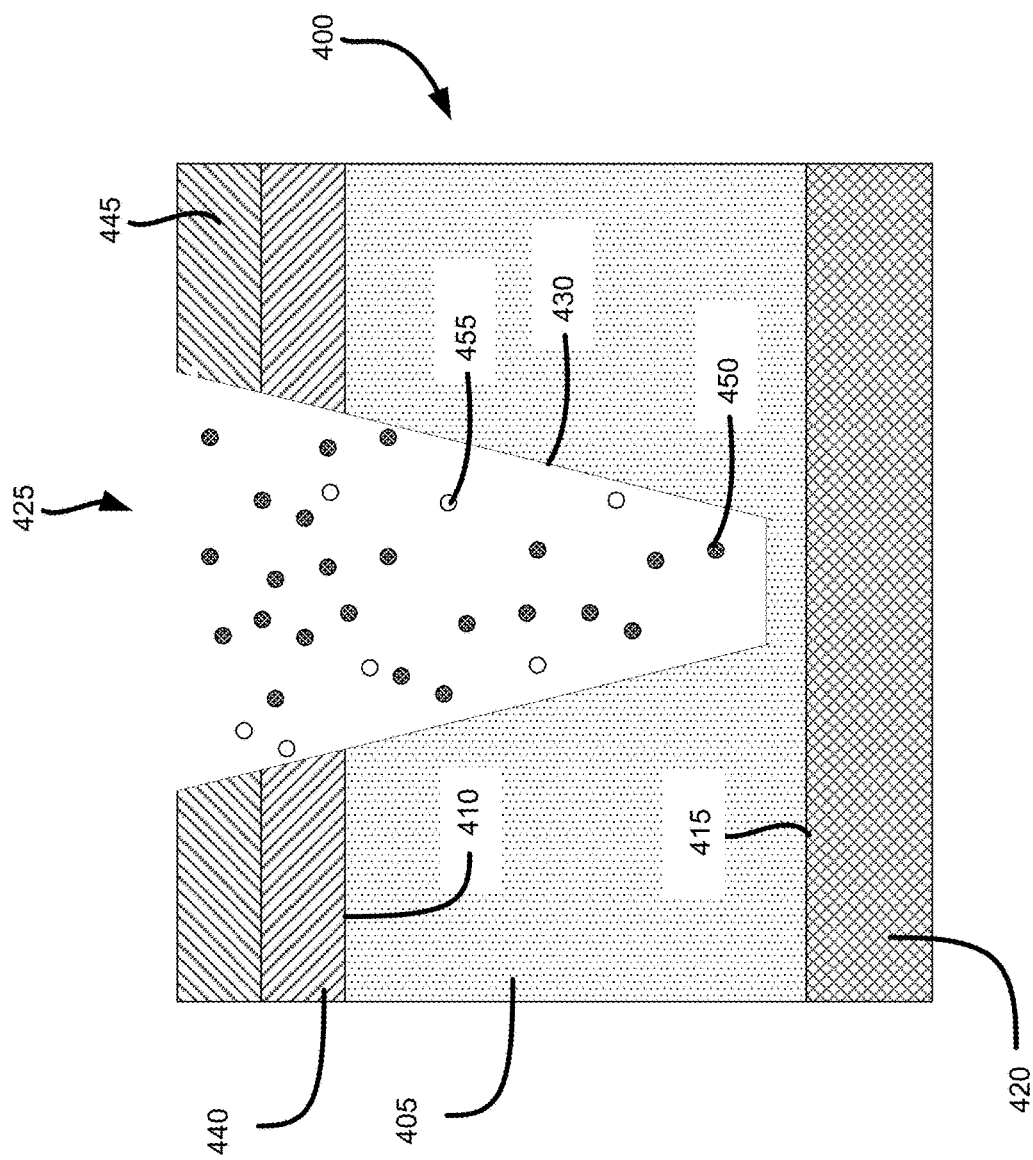
FIG. 4 depicts another stage of the process of generation of the substrate of FIG. 1, in accordance with various embodiments herein.

FIG. 4 depicts another stage of the process of generation of the substrate of FIG. 1, in accordance with various embodiments herein. Specifically, FIG. 4 depicts a configuration 400 that may occur subsequent to generation of the configuration 300 of FIG. 3. In embodiments, the configuration 400 may include a metal layer 420, build-up layer 405 with first surface 410, PET layer 440, a protective metal layer 445, and a via 425 with sidewalls 430 that may be respectively similar to metal layer 320, build-up layer 305 with first surface 310, PET layer 340, protective metal layer 345, via 325 and sidewalls 330.

As shown in FIG. 4, a plasma desmear process may be performed on configuration 400. As noted above, the plasma desmear process may be generally accomplished by CCP, ICP, REI, or some other type of plasma systems using oxygen (O2) and/or fluorinated gases to etch organic layers of the dielectric material. The plasma desmear process may result in reactive species 450 and consumed species 455 being present within the via 425. The reactive species 450 may be particles or molecules that may chemically react with the build-up material of the build-up layer 405. This reaction may remove a portion of the build-up layer 405 and generate consumed species 455.

Generally, the protective metal layer 445 may not be reactive with the reactive species 450 of the plasma desmear process. Therefore, a greater amount of reactive species 450 may enter the via 425 and interact with the build-up layer 405 to expose the surface 415 of the metal layer 420.

In some embodiments, the thickness of the PET layer 440 may affect the rate or quality of the etch of the build-up layer 405 performed by the plasma desmear process. Specifically, the aspect ratio of the via 425, that is the ratio between the depth of the via 425 and the diameter of the via 425, may decrease by decreasing the thickness of the PET layer 440.

Figure 5:
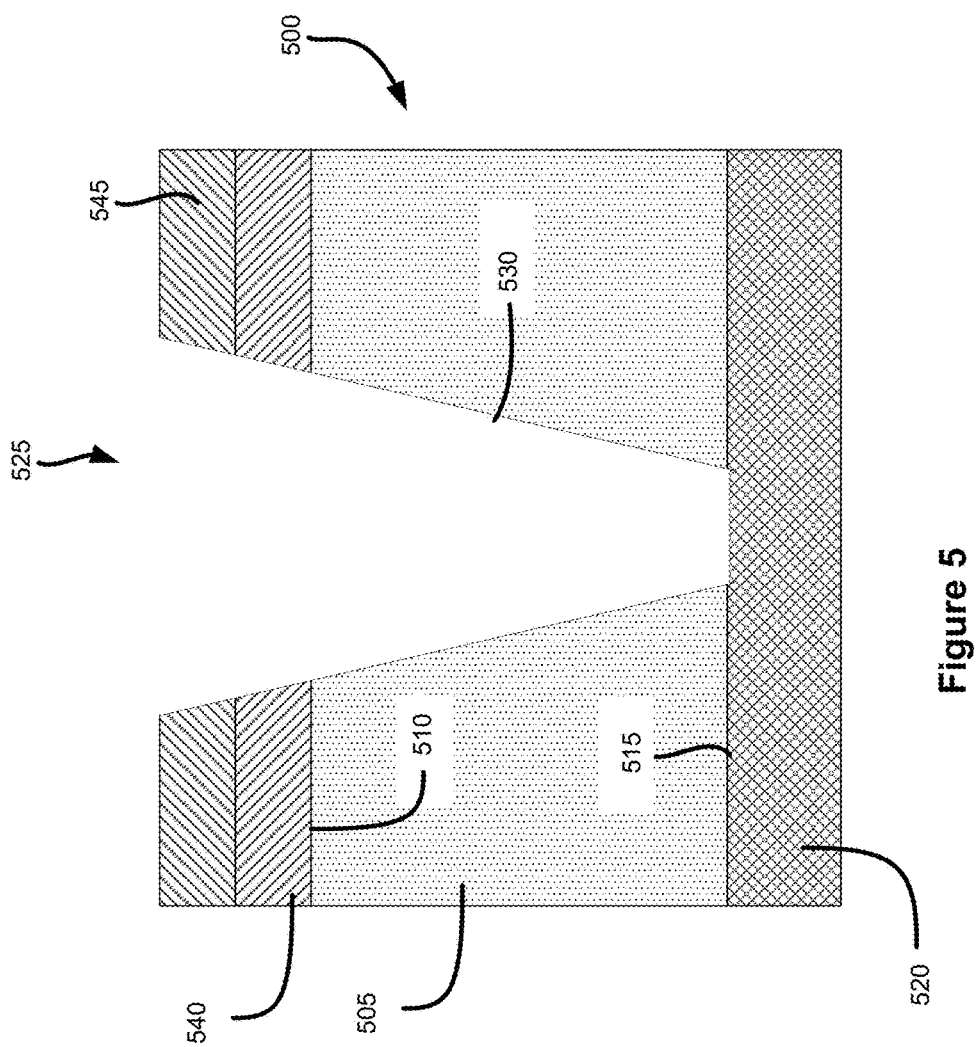
FIG. 5 depicts another stage of the process of generation of the substrate of FIG. 1, in accordance with various embodiments herein.

FIG. 5 depicts another stage of the process of generation of the substrate of FIG. 1, in accordance with various embodiments herein. Specifically, FIG. 5 depicts a configuration 500 that may occur subsequent to generation of the configuration 400 of FIG. 4. In embodiments, the configuration 500 may include a metal layer 520, build-up layer 505 with first surface 510, PET layer 540, protective metal layer 545, and a via 525 with sidewalls 530 that may be respectively similar to metal layer 420, build-up layer 405 with first surface 410, PET layer 440, protective metal layer 445, via 425, and sidewalls 430.

As shown in FIG. 5, the desmear process may have removed the remainder of the build-up layer 505 within the via 525, exposing the surface 515 of the metal layer 520. As shown, the sidewalls 530 of the via 525 may be relatively unaffected by the desmear process, and still retain a generally uniform slope from the part of the via 525 near the protective metal layer 545 to the part of the via 525 near the metal layer 520.

Finally, to generate the substrate 100 of FIG. 1, the PET layer 540 and the protective metal layer 545 may be removed from the build-up layer 505, for example, by peeling the PET layer 540 from the build-up layer 505. Peeling the PET layer 540 may result in removal of the protective metal layer 545, which is coupled with the PET layer 540 (for example, by lamination of the PET layer 540 to the protective metal layer 545). As noted above, through this process, the surface 110 of the build-up layer 105 may have an Ra value of between approximately 50 nm and approximately 100 nm. Additionally, as mentioned above, the sides 130 of the via 125 may be relatively smooth and well formed, with a generally uniform slope from the surface 110 to the surface 155 of the build-up layer 105. Finally, the substrate 100 may be generated without the relatively high-cost process of applying a protective metal layer directly to the build-up layer and then subsequently removing the protective metal layer by way of a mask etch process. Additionally, the substrate 100 may be generated without requiring a reactive gas in plasma systems such as carbon tetrafluoride (CF4), which may be more cost friendly.

Figure 6:
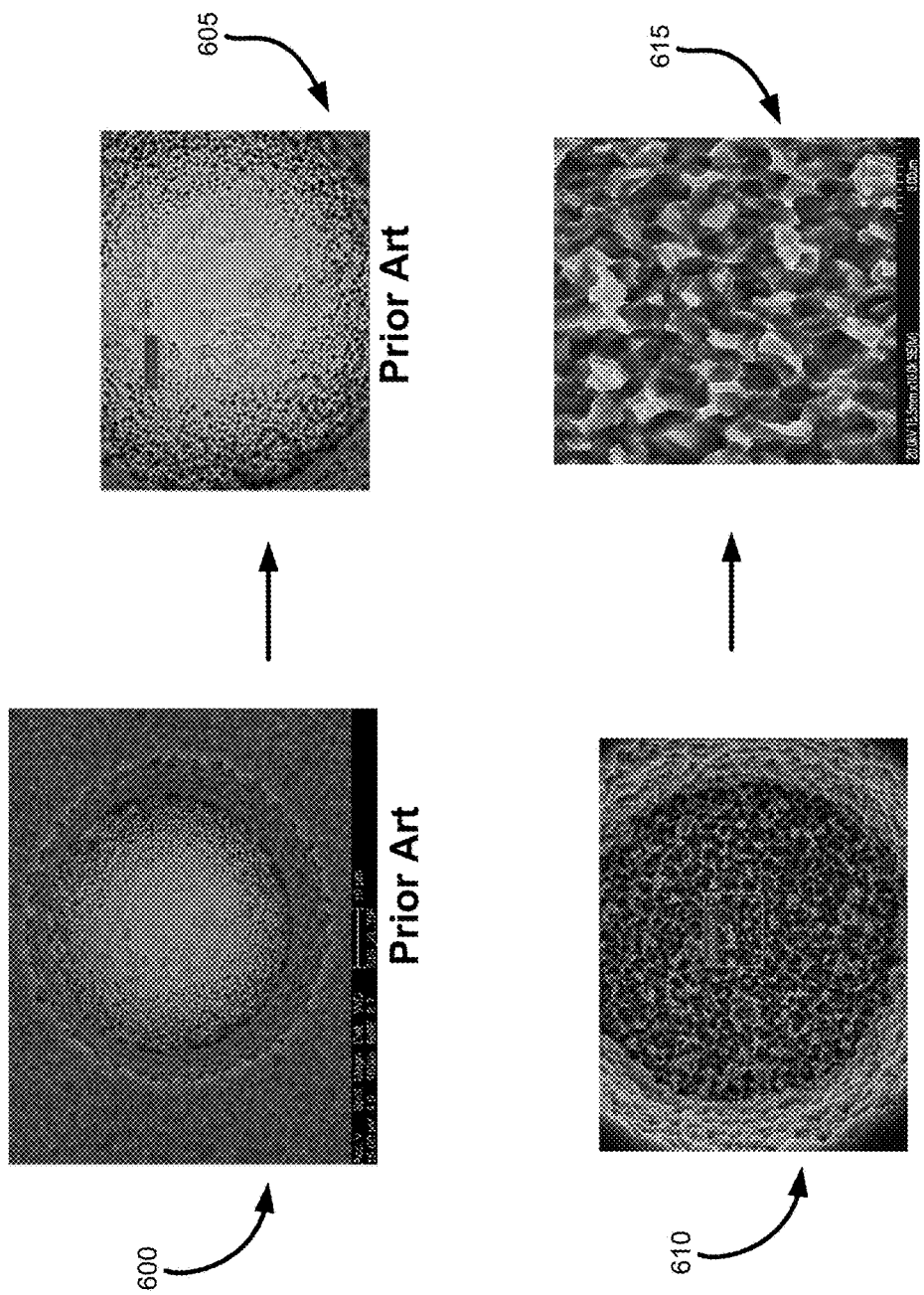
FIG. 6 depicts example images of vias formed in substrates in accordance with various processes described herein.

FIG. 6 depicts an example image 600 for a legacy desmear process that utilizes only a PET layer without a protective metal layer, and an image 610 for a desmear process that utilizes both a PET layer and a protective metal layer in accordance with various embodiments. Image 605 depicts a more detailed image of the bottom of the via of image 600. As can be seen, there may still be a resin smear within the via of images 600 and 605. This resin smear may be a result of, for example, reaction of the reactive species of the plasma desmear material with the PET layer.

By contrast, image 615 depicts a more detailed image of the bottom of the via (which may be similar, for example, to via 125) of image 615. As can be seen in FIG. 6, the sidewalls and the bottom of the via of images 610 and 615 may be relatively clean and free of the resin smear shown in FIGS. 600 and 605.

Figure 7:
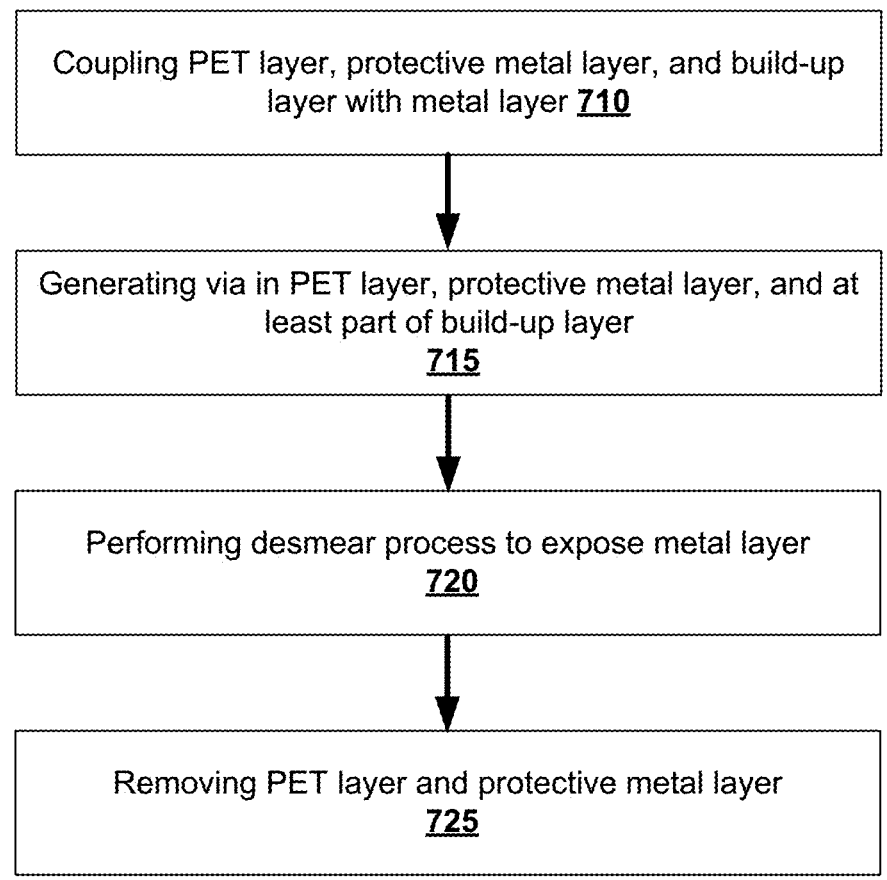
FIG. 7 depicts an example process for forming the substrate of FIG. 1, in accordance with various embodiments herein.

FIG. 7 depicts an example process for forming the substrate of FIG. 1, in accordance with various embodiments herein. Initially, a PET layer such as PET layer 240, a build-up layer such as build up layer 205, and a protective metal layer such as protective metal layer 245 may be coupled with a metal layer such as metal layer 220 at 710. As discussed above, in some embodiments the different layers may be deposited in different orders such that certain of the layers may be coupled with one another before another of the layers.

Subsequently, a via such as via 325 may be generated in a PET layer such as PET layer 340, a protective metal layer such as protective metal layer 345, and at least part of a build-up layer such as build-up layer 305 at 715.

Subsequently, a plasma desmear process may be performed at 720 to expose the metal layer such as metal layer 520 at 720.

Subsequently, the PET layer and the protective metal layer may be removed at 725 to generate the substrate 100 of FIG. 1.

Figure 8:
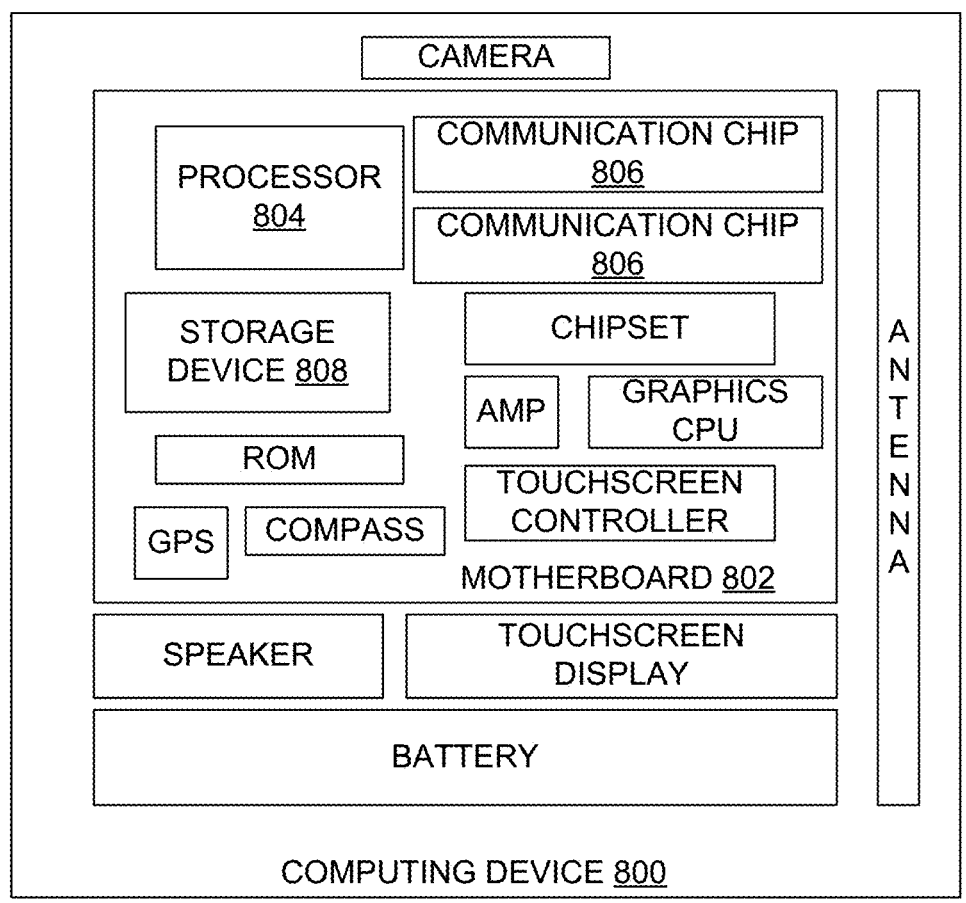
FIG. 8 is an example computing device that may include the package of FIG. 1, in accordance with various embodiments.

Embodiments of the present disclosure may be implemented into a system using the packages and manufacturing techniques disclosed herein. FIG. 8 schematically illustrates a computing device 800, in accordance with some implementations, which may include the substrate 100 of FIG. 1.

The computing device 800 may be, for example, a mobile communication device or a desktop or rack-based computing device. The computing device 800 may house a board such as a motherboard 802. In embodiments, the motherboard 802 may be constructed of the substrate 100 of FIG. 1. The motherboard 802 may include a number of components, including (but not limited to) a processor 804 and at least one communication chip 806. Any of the components discussed herein with reference to the computing device 800 may include the substrate 100 of FIG. 1. For example, the substrate 100 may be part of a component such as a processor, a memory, a storage device, a system on chip (SoC), or an element thereof such as an interposer, a patch, and/or a die.

The computing device 800 may include a storage device 808. In some embodiments, the storage device 808 may include one or more solid state drives. Examples of storage devices that may be included in the storage device 808 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 800 may include other components that may or may not be physically and electrically coupled to the motherboard 802. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 806 and the antenna may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth, and a second communication chip 806 may be dedicated to longer range wireless communications such as GPS, EDGE, GPRS, CDMA, WiMAX, LTE, EV-DO, and others. In some embodiments, the communication chip 806 may support wired communications. For example, the computing device 800 may include one or more wired servers.

The processor 804 and/or the communication chip 806 of the computing device 800 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data. In some embodiments, the recessed conductive contacts disclosed herein may be implemented in a high-performance computing device.

The following paragraphs provide examples of various ones of the embodiments disclosed herein.

Example 1 may include a substrate comprising: a metal layer with a first side and a second side opposite the first side; a build-up layer with a first side coupled with the first side of the metal layer, and a second side opposite the first side, the second side having an average roughness (Ra) of between approximately 50 nanometers (nm) and approximately 100 nm; and a frustoconical via in the build-up layer, wherein a first diameter of a first side of the frustoconical via at the first side of the build-up layer is smaller than a second diameter of a second side of the frustoconical via at the second side of the build-up layer.

Example 2 may include the substrate of example 1, wherein the second side includes one or more traces with a respective trace width of less than approximately 3 micrometers (μm) and a trace space of less than approximately 3 μm.

Example 3 may include the substrate of example 1, wherein the metal layer includes copper.

Example 4 may include the substrate of example 1, wherein the frustoconical via has an approximately linear slope between the first side of the frustoconical via and the second side of the frustoconical via.

Example 5 may include the substrate of any of examples 1-4, wherein the metal layer is exposed at the first side of the frustoconical via.

Example 6 may include the substrate of any of examples 1-4, wherein the build-up layer includes an organic resin and a hardener with an inorganic filler.

Example 7 may include a method comprising: coupling a polyethylene terephthalate (PET) layer, a protective metal layer, and a build-up layer to a metal layer such that the build-up layer is between the PET layer and the metal layer, and the PET layer is between the protective metal layer and the build-up layer; generating a frustoconical via in the protective metal layer, the PET layer, and the build-up layer; performing a desmear process such that the metal layer is exposed in the frustoconical via; and removing the PET layer from the build-up layer.

Example 8 may include the method of example 7, wherein removing the PET layer includes peeling the PET layer.

Example 9 may include the method of example 7, wherein removing the PET layer includes removing the protective metal layer.

Example 10 may include the method of example 7, wherein the desmear process is a plasma desmear process.

Example 11 may include the method of any of examples 7-10, wherein the PET layer and the protective metal layer are coupled to one another prior to coupling the PET layer and the protective metal layer to the build-up layer.

Example 12 may include the method of any of examples 7-10, wherein generating the frustoconical via includes laser drilling the frustoconical via.

Example 13 may include the method of any of examples 7-10, wherein the frustoconical via has a first diameter that is coplanar with the protective metal layer and that is larger than a second diameter of the frustoconical via that is coplanar with the build-up layer.

Example 14 may include the method of any of examples 7-10, wherein the PET film is a polyethylene naphthalate PET film.

Example 15 may include a package comprising: a die coupled with a substrate; wherein the substrate includes: a metal layer with a first side and a second side opposite the first side; a build-up layer with a first side coupled with the first side of the metal layer, and a second side opposite the first side, the second side having an average roughness (Ra) of between approximately 50 nanometers (nm) and approximately 100 nm and one or more traces with a trace width of less than approximately 3 micrometers (μm) and a trace space of less than approximately 3 μm; and a frustoconical via in the build-up layer, wherein a first diameter of a first side of the frustoconical via at the first side of the build-up layer is smaller than a second diameter of a second side of the frustoconical via at the second side of the build-up layer.

Example 16 may include the package of example 15, wherein the metal layer includes copper.

Example 17 may include the package of example 15, wherein the frustoconical via has an approximately linear slope between the first side of the frustoconical via and the second side of the frustoconical via.

Example 18 may include the package of any of examples 15-17, wherein the metal layer is exposed at the first side of the frustoconical via.

Example 19 may include the package of any of examples 15-17, wherein the build-up layer includes an organic resin and a hardener with an inorganic filler.

Example 20 may include the package of any of examples 15-17, wherein the die is a processor or a memory.

What is claimed is:

1. A substrate comprising:
 a metal layer with a first side and a second side opposite the first side;
 a build-up layer with a first side and a second side opposite the first side, the first side of the build-up layer coupled with the first side of the metal layer, the second side of the build-up layer having an average roughness (Ra) of between approximately 50 nanometers (nm) and approximately 100 nm;
 wherein an entire peeled surface of the second side of the build-up layer has a constant roughness; and
 a frustoconical via in the build-up layer, wherein a first diameter of a first side of the frustoconical via at the first side of the build-up layer is smaller than a second diameter of a second side of the frustoconical via at the second side of the build-up layer.

2. The substrate of claim 1, wherein the second side of the build-up layer includes one or more traces with a respective trace width of less than approximately 3 micrometers (μm) and a trace space of less than approximately 3 μm.

3. The substrate of claim 1, wherein the metal layer includes copper.

4. The substrate of claim 1, wherein the metal layer is exposed at the first side of the frustoconical via.

5. The substrate of claim 1, wherein the build-up layer includes an organic resin and a hardener with an inorganic filler.

6. The substrate of claim 1, wherein the frustoconical via has an approximately linear slope between the first side of the frustoconical via and the second side of the frustoconical via.

7. A method comprising:
 coupling a polyethylene terephthalate (PET) layer, a protective metal layer, and a build-up layer to a metal layer such that the build-up layer is between the PET layer and the metal layer, and the PET layer is between the protective metal layer and the build-up layer;
 generating a frustoconical via in the protective metal layer, the PET layer, and the build-up layer;
 performing a desmear process such that the metal layer is exposed in the frustoconical via;
 wherein the frustoconical via has a first side that is coplanar with the protective metal layer and a first diameter of the first side is larger than a second diameter of a second side of the frustoconical via that is coplanar with a side of the build-up layer;
 removing the PET layer from the build-up layer, wherein removing the PET layer includes peeling the PET layer and includes removing the protective metal layer;
 wherein an entire peeled surface of the side of the build-up layer has a constant roughness, and an average roughness (Ra) of the side of the build-up layer is between approximately 50 nanometers (nm) and approximately 100 nm.

8. The method of claim 7, wherein the desmear process is a plasma desmear process.

9. The method of claim 7, wherein the PET layer and the protective metal layer are coupled to one another prior to coupling the PET layer and the protective metal layer to the build-up layer.

10. The method of claim 7, wherein generating the frustoconical via includes laser drilling the frustoconical via.

11. The method of claim 7, wherein the PET layer is a polyethylene naphthalate PET film.

12. A package comprising:
 a die coupled with a substrate, wherein the substrate includes:
 a metal layer with a first side and a second side opposite the first side;
 a build-up layer with a first side and a second side opposite the first side, the first side of the build-up layer coupled with the first side of the metal layer, the second side of the build-up layer having an average roughness (Ra) of between approximately 50 nanometers (nm) and approximately 100 nm;

wherein an entire peeled surface of the second side of the build-up layer has a constant roughness;
a frustoconical via in the build-up layer, wherein a first diameter of a first side of the frustoconical via at the first side of the build-up layer is smaller than a second diameter of a second side of the frustoconical via at the second side of the build-up layer.

13. The package of claim 12, wherein the metal layer includes copper.

14. The package of claim 12, the second side of the build-up layer having one or more traces with a trace width of less than approximately 3 micrometers (μm) and a trace space of less than approximately 3 μm.

15. The package of claim 12, wherein the metal layer is exposed at the first side of the frustoconical via.

16. The package of claim 12, wherein the build-up layer includes an organic resin and a hardener with an inorganic filler.

17. The package of claim 12, wherein the die is a processor or a memory.

18. The package of claim 12, wherein the frustoconical via has an approximately linear slope between the first side of the frustoconical via and the second side of the frustoconical via.

* * * * *